(12) United States Patent
Lin et al.

(10) Patent No.: US 6,295,631 B1
(45) Date of Patent: Sep. 25, 2001

(54) METHOD FOR DETERMINING THE COMPENSATION VALUE OF THE WIDTH OF A WIRE BY MEASURING THE RESISTANCE OF THE WIRE

(75) Inventors: Wen-Yen Lin; Shih-Ting Huang, both of Taoyuan Hsien (TW)

(73) Assignee: Compeq Manufacturing Company Limited, Taoyuan Hsien (TW)

( * ) Notice: Subject to any disclaimer, the term of this patent is extended or adjusted under 35 U.S.C. 154(b) by 0 days.

(21) Appl. No.: 09/395,681

(22) Filed: Sep. 13, 1999

(51) Int. Cl.[7] .................................................. G06F 17/50
(52) U.S. Cl. ........................................................... 716/5
(58) Field of Search .................................................. 716/15

(56) References Cited

U.S. PATENT DOCUMENTS 5,587,920 * 12/1996 Muyshondt et al. ...................... 716/5
5,838,567 * 11/1998 Boggio, Jr. ................................ 716/5

* cited by examiner

*Primary Examiner*—Trong Phan
(74) *Attorney, Agent, or Firm*—Thomas, Kayden, Horstemeyer & Risley LLP

(57) ABSTRACT

A method is disclosed for determining a side-etching distance to compensate for the width of a wire to be formed on a printed circuit board. The wire is formed on a test board by etching off the copper foil on the test board with a film having the pattern of the wire. The wire is measured to find its resistance. The side-etching distance is obtained based on the formula: $W=[(\rho/t) \times L] \times (1/R) \pm \sigma$, where W is the width of the wire, $\rho$ is the resistance coefficient of the copper foil, t is the thickness of the copper foil, L is the length of the wire, and $\sigma$ is the side-etching distance.

4 Claims, 3 Drawing Sheets

| R(MOHM) WIDTH (MIL) | LOCATION 1 | LOCATION 2 | LOCATION 3 | LOCATION 4 | LOCATION 5 | LOCATION 6 | LOCATION 7 | LOCATION 8 | LOCATION 9 | LOCATION 10 | LOCATION 11 | LOCATION 12 | LOCATION 13 | LOCATION 14 | LOCATION 15 | LOCATION 16 | LOCATION 17 | LOCATION 18 | LOCATION 19 | LOCATION 20 |
|---|---|---|---|---|---|---|---|---|---|---|---|---|---|---|---|---|---|---|---|---|
| 2 | 4728 | 4808 | 4790 | 4650 | 4518 | 4345 | 4408 | 4439 | 4471 | 4510 | 4503 | 4415 | 4457 | 4425 | 4349 | 4306 | 4225 | 4384 | 4389 | 4384 |
| 3 | 2452 | 2507 | 2479 | 2445 | 2421 | 2343 | 2381 | 2369 | 2398 | 2409 | 2384 | 2396 | 2380 | 2387 | 2367 | 2338 | 2333 | 2351 | 2381 | 2358 |
| 4 | 1698 | 1704 | 1704 | 1682 | 1677 | 1642 | 1649 | 1662 | 1653 | 1673 | 1658 | 1656 | 1655 | 1644 | 1654 | 1639 | 1621 | 1643 | 1643 | 1648 |
| 5 | 1289 | 1307 | 1288 | 1288 | 1277 | 1255 | 1237 | 1263 | 1273 | 1268 | 1267 | 1277 | 1257 | 1264 | 1264 | 1260 | 1252 | 1260 | 1267 | 1251 |
| 6 | 1055 | 1048 | 1052 | 1042 | 1038 | 1023 | 1029 | 1034 | 1031 | 1032 | 1035 | 1030 | 1026 | 1026 | 1033 | 1023 | 1015 | 1031 | 1022 | 1022 |
| 7 | 874 | 882 | 878 | 876 | 868 | 857 | 868 | 863 | 870 | 866 | 866 | 869 | 857 | 866 | 864 | 858 | 864 | 863 | 862 | 856 |
| 8 | 758 | 755 | 757 | 754 | 748 | 744 | 746 | 747 | 748 | 748 | 749 | 748 | 744 | 744 | 748 | 746 | 738 | 750 | 742 | 743 |
| 9 | 664 | 667 | 664 | 662 | 659 | 655 | 659 | 654 | 658 | 661 | 654 | 659 | 654 | 655 | 659 | 656 | 660 | 663 | 655 | 654 |
| 10 | 592 | 596 | 590 | 592 | 587 | 586 | 590 | 586 | 589 | 584 | 585 | 591 | 586 | 586 | 586 | 588 | 584 | 586 | 585 | 594 |
| 11 | 537 | 537 | 534 | 534 | 531 | 530 | 532 | 531 | 532 | 532 | 531 | 532 | 529 | 528 | 534 | 530 | 582 | 543 | 527 | 526 |
| 12 | 508 | 497 | 497 | 496 | 495 | 492 | 495 | 494 | 493 | 495 | 492 | 495 | 488 | 490 | 497 | 497 | 490 | 498 | 491 | 488 |
| 13 | 454 | 450 | 447 | 448 | 445 | 443 | 447 | 444 | 444 | 444 | 444 | 445 | 439 | 443 | 448 | 443 | 443 | 447 | 442 | 438 |
| 14 | 418 | 417 | 414 | 413 | 410 | 409 | 411 | 410 | 411 | 410 | 410 | 413 | 406 | 409 | 415 | 417 | 408 | 414 | 411 | 409 |
| 15 | 393 | 384 | 384 | 382 | 397 | 382 | 382 | 381 | 383 | 381 | 380 | 384 | 379 | 379 | 385 | 387 | 381 | 387 | 384 | 378 |
| 16 | 364 | 361 | 357 | 358 | 356 | 357 | 358 | 358 | 357 | 356 | 356 | 359 | 355 | 354 | 359 | 363 | 356 | 356 | 355 | 354 |
| 17 | 344 | 337 | 335 | 335 | 333 | 333 | 336 | 332 | 334 | 336 | 335 | 338 | 331 | 322 | 331 | 337 | 334 | 338 | 337 | 330 |
| 18 | 321 | 317 | 316 | 315 | 312 | 313 | 315 | 314 | 315 | 313 | 313 | 316 | 314 | 311 | 309 | 312 | 315 | 313 | 313 | 307 |
| 19 | 303 | 299 | 298 | 296 | 295 | 296 | 298 | 295 | 297 | 297 | 298 | 299 | 296 | 294 | 293 | 303 | 300 | 295 | 296 | 294 |
| 20 | 292 | 286 | 283 | 283 | 281 | 281 | 284 | 281 | 283 | 282 | 283 | 285 | 279 | 282 | 278 | 290 | 286 | 282 | 282 | 277 |

FIG.2

METHOD FOR DETERMINING THE COMPENSATION VALUE OF THE WIDTH OF A WIRE BY MEASURING THE RESISTANCE OF THE WIRE

BACKGROUND OF THE INVENTION

1. Field of the Invention

The present invention relates to a method for determining the compensation value of the width of a wire to be formed on a printed circuit board, and more particularly, to a method for determining the compensation value of the width of a wire by measuring the resistance of the wire.

2. Description of Related Art

Because of advanced electronic technology, the operational speed of electronic element such as integrated circuit chips has increased rapidly. Therefore, the electrical performance of the PCB (printed circuit board) with integrated circuit chips has to be improved to meet the requirements of the high-speed electronic elements. Particularly, the width of the wire that is formed on the PCB board has to be precisely controlled during the process of manufacturing a PCB board. The actual width of the wire formed on a PCB board is usually different from the one the film provided for producing the PCB board. That is, the wire formed on a PCB board may be over-etched or under-etched. The difference in width between the wire on the film and the wire actually formed on the PCB board is known as side-etching distance $\sigma$. Side-etching distance $\sigma$ may influence the electrical performance of a PCB board. Therefore, compensation for side-etching distance $\sigma$ has to be provided in advance so that the desired wire width can be obtained when the wires are actually formed on the PCB board.

To make a proper compensation, the side-etching distance $\sigma$ has to be found by the following expression: $\sigma$=W (width of the wire patterned on the film) ±W (width of the wire formed on the PCB board). A conventional method to obtain the side-etching $\sigma$ is to take a cross-section step to locally cut off the wire formed on the PCB board and use a microscope to measure the width of the wire so that the side-etching distance $\sigma$ can be found by using the above expression. However, the method suffers the following disadvantages:

1. High Error Possibility: The measurement of width is only made to a small portion of the wire. The measured value does not represent the average width of the entire wire.
2. Time Consuming: The cross-section step requires lots of time to complete. Normally, it takes 15 minutes for a cutting operation, and the cut PCB board sample has to be cured, which takes another 25 minutes.
3. Waste of Material: The cut PCB board sample is useless after measurement and has to be thrown away.
4. Pollution: When the cut PCB board is cured, a chemical agent is required, which may cause pollution to the environment.

Accordingly, there is a need for the above method to be improved.

SUMMARY OF THE INVENTION

The objective of the present invention is to provide a method for determining the compensation value of the width of a wire to be formed on a printed circuit board by measuring the resistance of the wire.

To achieve the objective, the method in accordance with the present invention determines a side-etching distance to compensate for the width of a wire to be formed on a printed circuit board. A test board has multiple wires formed on a surface thereof. The wires are formed by etching off the copper foil on the test board with a film having the pattern of the wire. Each wire is measured to find its resistance. The side-etching distance is obtained based on the formula of $W=[(\rho/t) \times L] \times (1/R) \pm \sigma$, where W is the width of each wire, $\rho$ is the resistance coefficient of the copper foil, t is the thickness of the copper foil, L is the length of each wire, and $\sigma$ is the side-etching distance.

Other objectives, advantages, and novel features of the invention will become more apparent from the following detailed description when taken in conjunction with the accompanying drawings.

BRIEF DESCRIPTION OF THE DRAWINGS

FIG. 2 is a table showing the measured values of the resistance of the wires in the test board of FIG. 1.

DETAILED DESCRIPTION OF THE PREFERRED EMBODIMENT

The method in accordance with the present invention finds the side-etching distance $\sigma$ of a wire to be formed on a PCB board by measuring the resistance of the wire based on the formula: R=$\rho$(resistance coefficient of the copper foil on the PCB board)×L (length of the wire)/A (cross-sectional area of the wire). Once the side-etching distance $\sigma$ is obtained, the wire patterned on a film for producing PCB boards can be determined with side-etching distance $\sigma$ compensated in the wire pattern so that wires with desired widths can be formed on the PCB board.

In the above formula, A (cross-sectional area of the wire) is equal to W (width of the wire) ×t (thickness of the copper foil on the PCB board). Therefore, the above formula can be rewritten as:

$$R=\rho \times L/(w \times t) \qquad (1).$$

Because w (width of the wire formed on the PCB board)=W (width of the wire patterned on the film)±$\sigma$(side-etching distance). Equation (1) becomes:

$$R=\rho \times L/[(W \pm \sigma) \times t]=(\rho/t) \times L/(W \pm \sigma) \qquad (2).$$

Equation (2) can be rewritten as:

$$W=[(\rho/t) \times L] \times (1/R) \pm \sigma, \text{ where "+" stands for over-etching and "−"}$$

stands for under-etching.

Because L, W and ($\rho$/t) are known, the side-etching distance $\sigma$ can be obtained by measuring the resistance R.

Figure 1:
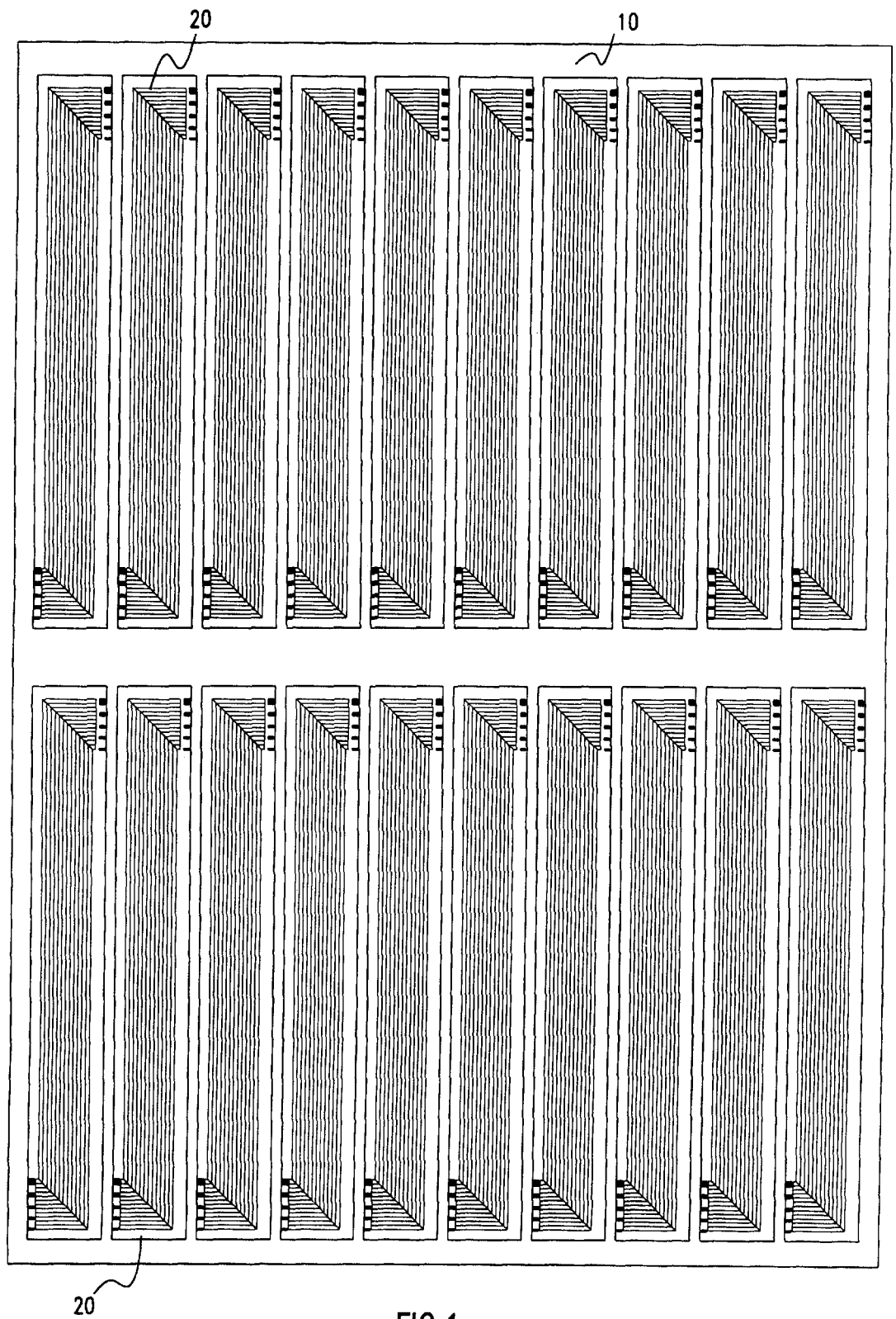
FIG. 1 is a schematic diagram showing a test board in accordance with the present invention.

In application, FIG. 1 shows a test board (10) surface with twenty wire bundles (20) formed thereon, each having twenty wires. In this preferred embodiment, the surface area of the PCB board is 16 inches×20 inches. Each wire has a length L of 9 inches and a width of 1~20 mil(s). The distance between every two adjacent wires of the same wire bundle (20) is 6 mils.

The wire bundles (20) are formed on the test board (10) in such a manner that a plain board having a layer of copper foil is provided, and the copper foil layer is etched by known etching techniques using a film with the pattern of the wire bundles (20) so that only the patterns of the wire bundles

(20) remain. After the etching process is completed and the wire bundles (20) are formed, the resistance of each wire of each wire bundle (20) is measured. The measured resistance of wires with different widths are recorded as shown in FIG. 2.

Figure 3:
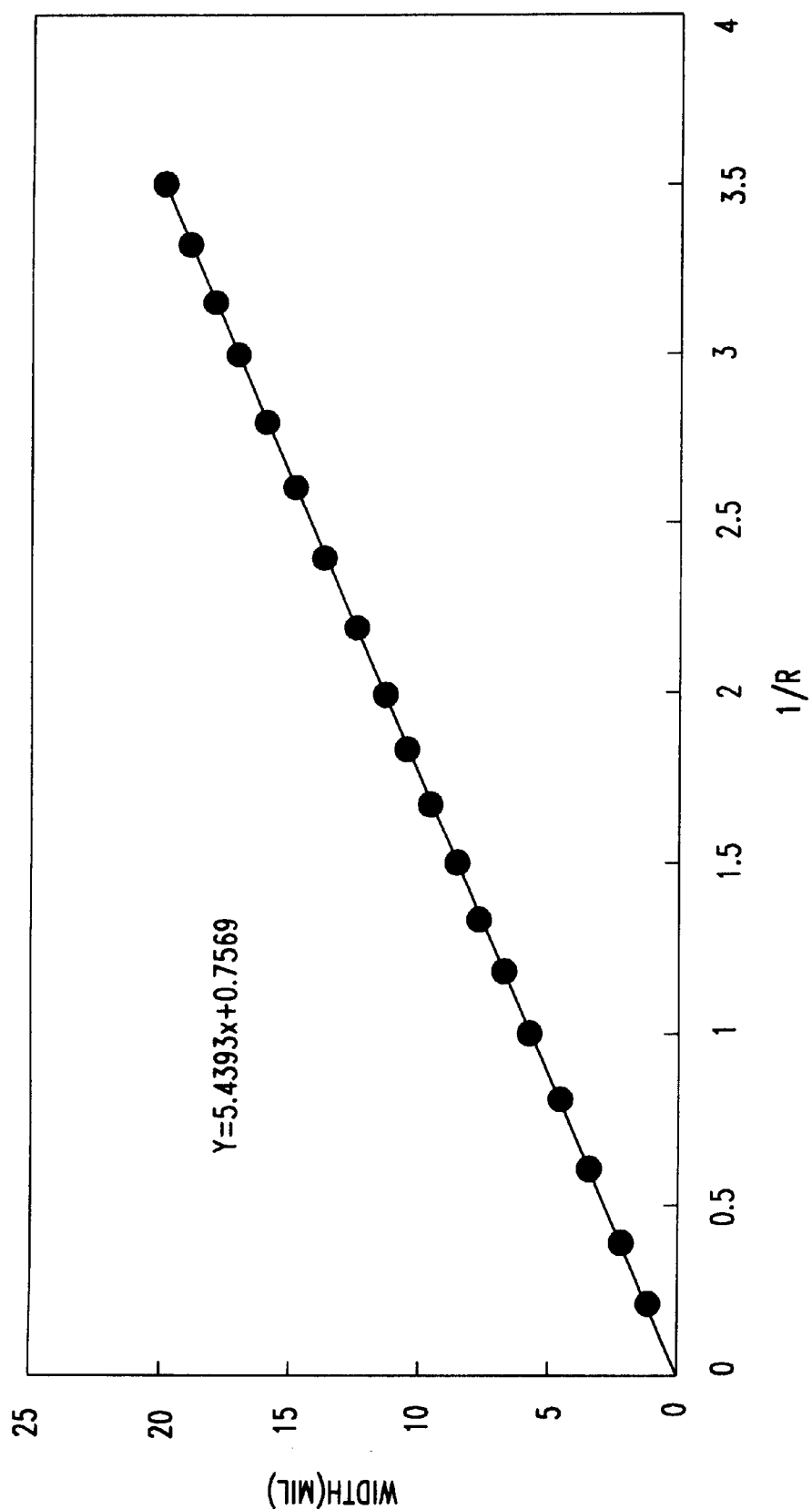
FIG. 3 is a x-y coordinate graph of the data in FIG. 2.

Based on the data in FIG. 2, a curve is plotted on a x-y coordinate, as shown in FIG. 3, by taking W as the x-axis and 1/R as y-axis. The curve conforms to a linear equation:

$$y=5.4393x+0.7569 \qquad (4).$$

By applying equation (4) to equation (3), it is known that $(\sigma/t) \times L$ is equal to 5.4393 and the side-etching distance $\sigma$ for each wire is +0.7569.

The obtained side-etching distance $\sigma$ is used for compensation when wire patterns are formed on a film for producing PCB boards. Taking a desired wire width of 20 mils as an example, the wire pattern on the film is compensated so that its wire width is 20.7569 mils. Accordingly, when wires are formed on the PCB board by etching the copper foil of the board, an additional 0.7569 mils of copper foil is removed and the resultant wire width is actually 20 mils.

The method in accordance with the present invention can also be applied to control the value of built-in resistance of a PCB board. Conventionally, in the PCB board manufacturing process, the value of $\rho/t$ is a constant coefficient and the value of L/w is adjusted to obtain the desired value of the built-in resistance. However, because of the side-etching phenomenon, the actual value of the built-in resistance may be different from the desired one. With the method in accordance with the present invention, the value of the side-etching distance can be ascertained in advance and the values of L and $\rho/t$ are also already known so that the difference between the actual built-in resistance and the desired one can be eliminated by taking the side-etching distance for compensation whereby a precise built-in resistance can be obtained.

In summary, the method in accordance with the present invention has the following advantages:

1. Low Error Possibility: The width of the wire is obtained by measuring the resistance of the whole wire so that the obtained value actually represents the average wire width.

2. Easy to Process: The method is undertaken by simply measuring the resistance of the wire without time-consuming cutting and curing operations.

3. No Waste of Material: The PCB board that is used for testing is still usable.

4. No Pollution: The method does not employ any potential pollutants.

Although the present invention has been explained in relation to its preferred embodiment, it is to be understood that many other possible modifications and variations can be made without departing from the spirit and scope of the invention as hereinafter claimed.

What is claimed is:

1. A method for determining the side-etching distance to compensate for the width of a wire to be formed on a printed circuit board, said wire being formed on a test board by etching off the copper foil on said test board with a film having the pattern of the wire, said method comprising the steps of:

measuring the resistance of said wire; and finding said side-etching distance based on the formula of $W=[(\rho/t) \times L] \times (1/R) \pm \sigma$, where W is the width of said wire, $\rho$ is the resistance coefficient of said copper foil, t is the thickness of said copper foil, L is the length of said wire, and $\sigma$ is the side-etching distance.

2. The method as claimed in claim 1, wherein said test board has a plurality of wire bundles, each having a plurality of wires and each wire is measured to find its resistance.

3. The method as claimed in claim 2, wherein said side etching distance is obtained based on said resistance of each wire.

4. The method as claimed in claim 1, which is applied to control built-in resistance of a PCB board in its manufacturing process by taking said side-etching distance for compensation.

* * * * *